United States Patent [19]

Van Laethem et al.

[11] 4,188,199
[45] Feb. 12, 1980

[54] METAL COMPOUND COATING ON A FACE OF A CONTINUOUSLY LONGITUDINALLY MOVING GLASS RIBBON AND APPARATUS FOR USE IN FORMING SUCH COATING

[75] Inventors: Robert Van Laethem, Loverval; Robert Leclercq, Auvelais; Philéas Capouillet, Gosselies; Albert Van Cauter, Charleroi, all of Belgium

[73] Assignee: BFG Glassgroup, Paris, France

[21] Appl. No.: 781,957

[22] Filed: Mar. 28, 1977

[30] Foreign Application Priority Data

Apr. 13, 1976 [GB] United Kingdom ............... 15063/76

[51] Int. Cl.$^2$ ...................... C03C 17/06; C03C 17/22
[52] U.S. Cl. .................................. 65/60 C; 65/60 D; 65/182 R; 118/305; 118/718; 427/248 C; 427/248 G; 427/251; 427/252; 427/255; 427/314; 427/424; 427/427
[58] Field of Search ............... 427/251, 314, 252, 289, 427/255, 229, 248 C, 248 G, 424, 427, 226, 419 A, 343, 350, 294, 367, 355; 118/305, 50, 50.1, 49, 49.1, 49.5; 65/60 D, 60 C, 60 B, 182 R

[56] References Cited

U.S. PATENT DOCUMENTS

| | | | |
|---|---|---|---|
| 2,724,658 | 11/1955 | Lytle | 427/424 |
| 3,004,875 | 10/1961 | Lytle | 427/424 |
| 3,019,136 | 1/1962 | Auffnorde et al. | 427/424 |
| 3,021,227 | 2/1962 | Richardson | 427/427 |
| 3,080,643 | 3/1963 | Hanink et al. | 427/367 |
| 3,632,406 | 1/1972 | Clough et al. | 427/353 |
| 3,876,450 | 4/1975 | Tanner | 427/343 |
| 4,018,631 | 4/1977 | Hale | 427/343 |
| 4,022,601 | 5/1977 | Sopko | 427/255 |

Primary Examiner—Ronald H. Smith
Assistant Examiner—Janyce A. Bell
Attorney, Agent, or Firm—Cushman, Darby & Cushman

[57] ABSTRACT

A process for forming a metal or metal compound coating on a face of a continuously longitudinally moving glass ribbon which comprises the steps of contacting the glass ribbon face while it is at elevated temperature, at a zone along the ribbon path, with a fluid medium containing a substance which undergoes chemical reaction or decomposition to form the metal or metal compound on the face, discharging at least part of the fluid medium against the face in stream formation having (1) a velocity component in the direction of movement of the glass ribbon and (2) an inclination to the face so that the acute or mean acute angle of incidence of the stream formation on the face, measured in a plane normal to the face and parallel with the direction of the glass ribbon movement, is not more than 60°.

30 Claims, 4 Drawing Figures

METAL COMPOUND COATING ON A FACE OF A CONTINUOUSLY LONGITUDINALLY MOVING GLASS RIBBON AND APPARATUS FOR USE IN FORMING SUCH COATING

This invention relates to a process for forming a metal or metal compound coating on a face of a continuously longitudinally moving glass ribbon by contacting such face while it is at elevated temperature with a fluid medium consisting of or containing one or more substances which undergo chemical reaction or decomposition to form the metal or metal compound on such face. The invention also relates to apparatus for use in carrying out the process.

Processes of the above kind are employed for forming coatings which modify the apparent color of the glass and/or which have some other required properties in respect of incident radiation, e.g., an infrared-reflecting property. In some of the known processes, the substance to be applied to the glass ribbon for forming the required coating is supplied in liquid phase, e.g. by spraying. In other cases the substance is supplied in the vapor phase.

The known processes have been found unsuitable for reliably forming coatings of a high quality sometimes demanded by industry. Coatings produced by the known processes have fallen short of these high quality requirements in respect of their performance under various tests relating to their effects on incident electromagnetic radiation. It is always difficult to insure an uninterrupted coverage of the substrate surface by a coating of substantially uniform thickness and even when these conditions are met the radiation reflecting or absorbing properties of the coating are often found to vary from one region to another.

The subject of this patent application is a coating process by which the quality standards attainable by the prior processes can be more easily obtained or can be improved upon.

According to the present invention, there is provided a process for forming a metal or metal compound coating on a face of a continuously longitudinally moving glass ribbon which includes the steps of contacting such face while it is at elevated temperature, at a zone along the ribbon path, with a fluid medium consisting of or containing one or more substances which undergo chemical reaction or decomposition to form the metal or metal compound on the face, discharging at least part of the fluid medium against the face as a stream or streams which, or at least one of which, has a velocity component in the direction of movement of the ribbon and is inclined to the face so that the acute or mean acute angle of incidence of such stream on the face, measured in a plane normal to the face and parallel with the direction of the ribbon displacement, is not more than 60°.

The invention may be understood by way of illustration with reference to the drawings.

Figure 1:
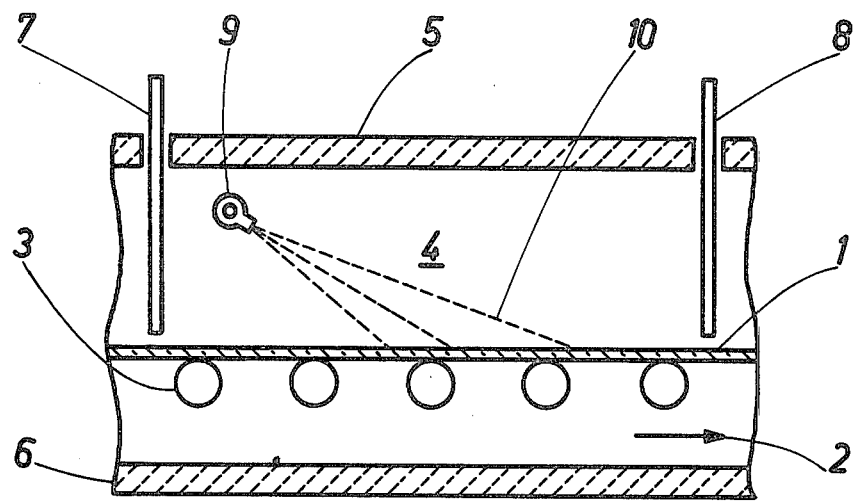
FIG. 1 is a sectional view of a coating chamber illustrating a method of depositing a metallic or metallic compound on a face of a glass ribbon according to the process of this invention incorporating the use of a gas nozzle.

Microscopic examination of coatings formed by processes according to the invention have shown them to be characterized by a glass-contacting stratum of homogeneous structure featuring a regular arrangement of crystals and this is thought to contribute to the quality standards which are attainable.

In some cases a well structured stratum or strata as above referred to may be overlaid by an upper stratum or strata which is or are of less regular structure and exhibits certain thickness variations. Whether this phenomenon exists or not depends in part on the overall thickness of the deposit and on other factors which are capable of control as will hereafter be described. If there is any such upper stratum of inadequate structural quality it can be removed by an after treatment as will be hereafter exemplified.

The invention is particularly valuable for forming good quality metal oxide coatings. Preferably the aforesaid angle or mean angle of incidence of the or at least one of the fluid streams is not more than 45°. When such maximum angle is observed the structural quality of at least a bottom stratum of the applied coating tends to be higher, other conditions being equal.

The invention includes processes wherein the or at least one said fluid stream is a parallel stream, all parts of which have substantially the same angle of incidence on the ribbon. If a fluid stream is used which diverges from its source, a proportion of the fluid medium composing the stream will, of course, be incident on the glass face at an acute angle in excess of the mean acute angle of incidence of such stream. It is beneficial for the results in view for the mean angle of incidence of the or at least one said stream and its angle of divergence from its source to be such that all parts of the stream have a velocity component in the direction of movement of the ribbon and are incident on the glass face at a substantial angle to the vertical. Preferably the angle of divergence of the stream, measured in a plane normal to the glass face being coated and parallel with the longitudinal dimension of the ribbon, is not more than 30°.

Preferably, the fluid stream or at least one of them, if there is more than one, is inclined to the face to be coated so that every part of such stream makes with the glass face, in a plane normal to said face and parallel with the longitudinal dimension of the ribbon, an acute incidence angle of not more than 60°. In particularly favored embodiments of the invention the said incidence angle for every part of the stream is not more than 45°.

If two or more streams of fluid medium are discharged against the glass face, e.g. streams of different compositions respectively containing a metal compound and an oxidizing agent which reacts with said compound under pyrolysis to form a metal oxide coating on the glass, good results can be achieved if one or more but not all of such streams is or are incident on the glass at an angle or mean angle of not more than 60° as hereinbefore referred to. However it is preferable for all of the streams to fulfill that maximum angle condition.

It is not essential for all of the required fluid medium to be discharged as a stream or streams against the ribbon face to be coated. In some processes according to the invention, some of the said fluid medium with which said ribbon face is contacted at said zone is induced to flow to said zone by the action of the said fluid stream or streams. For example, a coating may be formed by reaction of substances one of which is discharged against the ribbon face in an inclined fluid stream, and the other of which forms or is carried in a current of fluid which is induced to flow into the zone where said stream impinges against said face.

In a particular example, a metal oxide coating is formed by discharging a vaporized metal compound against the glass face as a stream, the momentum and inclination of which is such as to induce a current of air to flow to the said zone whereby a coating of metal oxide is formed at said zone. Such induced flow may be horizontal or at an inclination to the glass face. Instead of using an inclined stream to induce a flow of air or other fluid medium to the coating zone, such flow may be brought about in some other way, e.g., by propelling a current of such fluid into said zone along a path parallel with the ribbon face to be coated.

A process according to the invention can be performed quite conveniently in many existing flat glass production plants with little or no modification of the plant layout. The facility with which this can be done is attributable in part to the convenience with which fluid discharge means can be accommodated if it is disposed for discharging a fluid stream or fluid streams at an inclination to the face of the glass ribbon.

Particular importance is attached to processes according to the invention wherein the face on which the coating is formed is the top face of a continuous ribbon of float glass which is in the course of being formed. In this field of application, preference is given to processes wherein each fluid stream impinges on the top face of the ribbon at a zone which is located downstream from the float tank and is a zone at which the temperature of the glass is within the range 100° to 650° C.

For forming a coating which over its full thickness possesses a regular structure, as hereinbefore referred to, it is advantageous to achieve a fairly high rate of growth of the coating thickness. The rate of growth of the coating thickness is influenced by the speed of the ribbon and the volume rate of supply of the coating substance to the coating zone, other coating conditions remaining the same. The growth rates which are realizable in a given process, consistent with homogeneity of coating structures, depends on the nature of the coating substance employed and its physical state as supplied to the coating zone.

Advantageously, the speed of movement of the glass ribbon and the volume rate of supply of the substance to the coating zone are such that the growth rate of the coating thickness is at least 1,000 Å of coating thickness per second. Very good results have been achieved in processes where the thickness growth rate was 1,200 Å/sec. and even 1,500 Å/sec.

In certain embodiments of the invention, following coating of a given portion of the ribbon, the coating on that portion is subjected to a surfacing treatment whereby a top stratum or strata of the coating is removed. Such a surfacing treatment is not necessary if the coating as formed is of the required structural standard over its full thickness. However, such treatment can be performed in all cases without disadvantages and generally with some advantage in terms of coating quality. As an example, surfacing is achieved by means of a suspension of alumina in distilled water. Such medium can be rubbed over the coating for some minutes with a rotary motion by a cloth or brush, and the coating can subsequently be rinsed free from alumina powder.

The best results from the standpoint of coating quality are attained when the coating as formed on the ribbon face is from 100 to 10,000 Å or more in thickness.

A further optional but advantageous feature is the exertion of force by means extraneous to the fluid stream to maintain flow of gas away from the coating zone and away from the source of the stream. This feature promotes the formation of very high quality coatings, e.g. coatings having a thickness and optical properties which are very uniform over a large area. In a preferred embodiment, suction forces are exerted to draw gas away from the coating zone and the source of the fluid stream. The maintenance of such gas flow is helpful in enabling thicker coatings of good structure to be formed without necessity for the coating to be subjected to some after treatment for removing a top stratum of the coating.

In certain embodiments of the invention the substance undergoing the chemical reaction or decomposition is delivered to said face in gaseous phase. Preferably the stream discharged against the glass ribbon face is gaseous and is discharged so that such stream contacts the ribbon face simultaneously at all positions across the whole or substantially the whole of the ribbon width. As thus performed, the process enables coatings to be built up rapidly, e.g. at a rate of at least 700 Å of coating thickness per second. Such embodiments promise to be of special importance when coating glass ribbons in course of continuous production at high speeds, e.g. speeds in excess of 2 meters per minute and even in excess of 10 meters per minute, such as are often attained by the float process.

It is very suitable to form metal oxide coatings from a substance or substances supplied in the gaseous phase. Coatings of other metal compounds can, however, also be formed from the gaseous phase, e.g. a coating of metallic boride, sulphide, nitride, carbide or arsenide can be formed by reaction of a corresponding organometallic compound with a halogenated boron compound, $H_2S$, $NH_3$, $CH_4$ or an arsenic containing compound, in the absence of oxygen. Metal coatings can also be formed from the gaseous phase. For example, a coating of nickel can be formed by decomposing nickel carbonyl under the action of heat provided by the heated ribbon, in a reducing atmosphere or at least in the absence of oxygen.

In some embodiments wherein a metal oxide coating is formed from the gaseous phase, a stream of oxygen or oxygen containing gas and a separate stream of a vaporized metal compound with which oxygen reacts to form a metal oxide coating on the ribbon face to be coated are continuously supplied to such ribbon face at the reaction zone. In a particular and important embodiment, use is made of a stream of a vaporized tin compound and a stream or streams of oxygen-containing gas for forming a tin oxide coating. However, various other metal oxide coatings can be formed in that manner, e.g. a coating of titanium dioxide by reacting titanium tetrachloride with oxygen. The vaporized metal compound will usually be diluted with an inert gas, e.g. nitrogen, and the vapor stream may contain additional ingredients for modifying the properties of the coating. For example, the vapor stream may contain antimony chloride for forming antimony dioxide together with the principal oxide ingredient of the coating.

Instead of delivering in gaseous form the substance or substances undergoing chemical reaction or decomposition, the required coating metal or metal compound can be formed from a compound in liquid phase. Thus the invention includes processes wherein the fluid medium discharged against the face of the glass ribbon comprises at least one stream of droplets comprising a metal compound which by pyrolysis forms the coating metal or metal compound on such face.

For example, the invention includes processes wherein the fluid medium discharged against the glass ribbon face comprises at least one stream of droplets of a liquid composition containing a metal salt which by pyrolysis forms a metal oxide coating. In certain very advantageous processes, use is made of at least one droplet stream comprising droplets of an aqueous or non-aqueous medium containing a tin compound, e.g. $SnCl_4$, for forming a tin oxide coating. The said medium may contain a doping agent, e.g. a substance providing ions of antimony, arsenic or fluorine. The metal salt can be used with a reducing agent, e.g. phenyl hydrazine, formaldehyde, alcohols and non-carbonaceous reducing agents such as hydroxylamine and hydrogen. Other tin salts may be used in place of or in addition to stannic chloride, e.g., stannous oxalate or stannous bromide. Examples of other metal oxide coatings which can be formed in a similar manner include oxides of cadmium, gold, magnesium and tungsten. For forming such coatings, the coating composition can likewise be prepared by forming an aqueous or organic solution of a compound of the metal and a reducing agent. As a further example the invention can be employed for forming coatings by pyrolysis of organometallic compounds, e.g. a metal acetylacetonate, supplied in droplet form to the substrate face to be coated. It is within the scope of the invention to apply a composition containing salts of different metals so as to form a metal coating containing a mixture of oxides of different metals.

In some embodiments of the invention, use is made of at least one droplet stream which is displaced to and fro transversely of the ribbon path. By carrying out the invention in that way, a ribbon of glass can be coated over substantially its entire width while using a single droplet discharge head of small dimensions so that the rate of supply of the metal compound can be easily controlled.

In alternative embodiments employing a droplet feed, use is made of one or more droplet streams whose impingement zone or combined impingement zones on the glass ribbon extend across substantially the whole of the ribbon width. In that case the entire ribbon can be coated without displacing the source of the droplet stream. Moreover, the area coating rate can be quite high so that the process can be easily performed for coating a relatively fast moving ribbon of glass as it travels from the ribbon forming plant.

Experiments indicate that good results are promoted if certain conditions are observed with respect to the distance between the glass face being coated and the position from which each droplet stream is discharged toward such face. Preferably such position, for each said stream, is at a distance from said face, measured normally to such face, of from 15 to 35 cm. This has been found to be the most suitable range, particularly when observing the preferred inclination and divergency ranges for the droplet stream hereinbefore referred to.

The invention includes apparatus suitable for use in forming a metal or metal compound coating on a face of a glass ribbon by a process according to the invention as hereinbefore defined. Apparatus according to the present invention comprises means for supporting a continuously longitudinally moving heated glass ribbon, and means for discharging fluid medium against a face of such ribbon, and is characterized in that the said discharge means is constructed and arranged to discharge at least one stream of fluid medium against said face in a direction which is inclined thereto so that the stream has a velocity component in the direction of movement of the ribbon, the acute or mean acute angle of incidence of such stream on said face, measured in a plane normal to said face and parallel with the longitudinal direction of the ribbon being not more than 60°.

Apparatus according to the invention as above defined may embody any one or more features enabling any one or more of the various optional process features hereinbefore described to be employed. For example, the invention includes apparatus as above defined and wherein there is provided gas exhaust means for generating suction forces which during use of the apparatus maintain a flow of gas away from the region where the streams of fluid medium make contact with the glass ribbon and away from the source of such streams, and/or means for displacing said discharge means to and fro transversely of the ribbon path.

In particularly advantageous embodiments of apparatus according to the invention, it is installed downstream from a float tank for coating the top face of a ribbon of float glass as it travels away from the tank.

Certain apparatus according to the invention, selected by way of example, are illustrated in the accompanying drawings in which FIGS. 1 to 4 are similar dragrammatic side views partly in vertical section, illustrating the principal parts of four different coating apparatus according to the invention.

Each of the illustrated forms of apparatus is installed for use in coating a continuous longitudinally moving glass ribbon as it comes from a manufacturing plant.

In FIG. 1, the glass ribbon 1 is shown in course of conveyance on rollers 3, in the direction indicated by arrow 2, through a compartment 4 in a gallery having refractory roof and sole walls 5 and 6. At the ends of the compartment there are displaceable refractory screens 7,8. A spray gun is mounted above the path of the glass ribbon for directing a stream of droplets 10 toward and at an inclination to the top face of the ribbon. The spray gun can, for example, be used for spraying liquid containing one or more substances which decompose or react at the top face of the ribbon to form a coating thereon. The central axis of the droplet stream is in a plane parallel with the direction of movement of the ribbon and is inclined to the ribbon faces at an angle of not more than 60°. Mechanism (not shown) is provided for displacing the spray gun to and fro along a horizontal path transverse to the direction of movement of the glass ribbon.

The compartment 4 forms part of an annealing gallery associated with a float tank for forming a ribbon of float glass. The same coating apparatus can be installed and used in the same way in an annealing gallery adjoining the drawing chamber of a Libbey-Owens type sheet glass drawing machine.

Instead of locating the coating apparatus in a part of a gallery in which annealing of the float glass ribbon occurs the coating apparatus could be located for coating the glass ribbon at a position between the float tank and the place where annealing commences.

Figure 2:
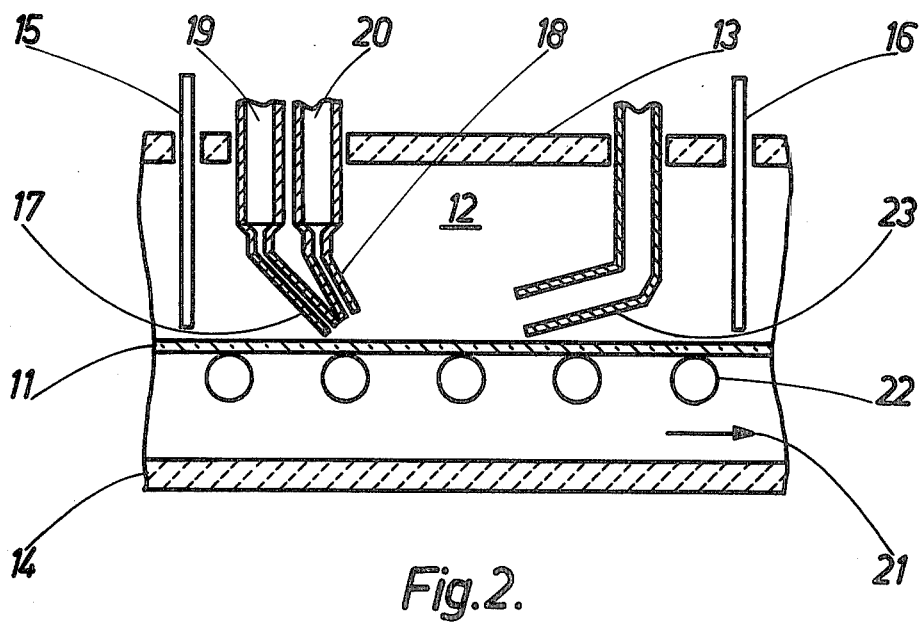
FIG. 2 is a sectional view of an embociment of the invention using feed channels instead of a gas nozzle and further an exhaust duct.

In the apparatus represented in FIG. 2, a glass ribbon 11 is coated in a compartment 12, like compartment 4 in FIG. 1. The compartment forms part of a gallery having roof and sole walls 13, 14 and end screens 15, 16. The two feed channels 17, 18 extend across substantially the full width of the ribbon path and serve to direct streams of gaseous substances from gas containers 19, 20 against the top face of the glass ribbon at an inclination thereto, as the ribbon is being conveyed in the direction of arrow 21 on rollers 22. By way of example, different vaporized substances entrained in currents of carrier gas can be discharged along the feed channels 17 and 18 so that the substances react in the vicinity of the top face of the ribbon and form a coating thereon. The channel 17 is inclined to the glass ribbon faces at an angle of 45° or less; the channel 18 is inclined to channel 17 at an angle 20° to 35°. An exhaust duct 23 defining an exhaust passage extending over substantially the full width of the ribbon path is disposed at an opposite inclination to the glass ribbon, with its exhaust gas entry end pointing generally toward the zone where a coating becomes formed on the ribbon from the substances discharged via the feed channels 17 and 18. The exhaust duct 23 is connected to means (not shown) for maintaining sub-atmospheric pressure in the said duct so that gases are drawn into the duct from the coating zone.

Figure 3:
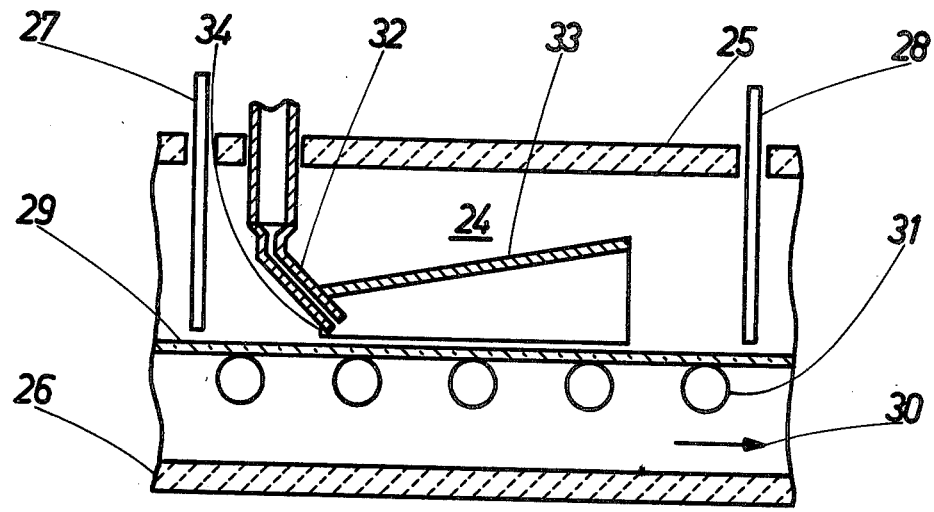
FIG. 3 is a sectional view of an embodiment using a feed channel and a hood.

The coating apparatus shown in FIG. 3 is installed in a compartment 24 of a gallery having roof and sole walls 25, 26 and end screens 27, 28. A glass ribbon 29 is conveyed through the coating station in the direction of arrow 30 on rollers 31. The coating apparatus comprises a feed channel 32 similar to the feed channel 17 or 18 in FIG. 2 and inclined to the glass ribbon at an angle of 60° or less. This feed channel can, for example, be used for conducting toward the top face of the ribbon vapors of one or more metallic compounds, entrained in a carrier gas stream, such as vapors which react or undergo decomposition at the exposed surface of the hot glass ribbon and give rise to the formation of a metal oxide coating layer thereon. A hood 33 is provided which is disposed a short distance above the glass ribbon and extends for some distance in the downstream direction from the vicinity of the discharge end of the feed channel 32. The hood has a top wall which, as shown, slightly diverges from the plane of the glass ribbon in the downstream direction, and two opposed side walls. The hood thus defines with the top surface of the glass ribbon a flow passage along which gases can flow away from the feed channel 32. The vertical distance between the top face of the glass ribbon and the top of hood 33 at its downstream end is not more than 40 mm. The discharge end of feed channel 32 is spaced slightly above the top face of the glass ribbon so as to leave a gap 34 through which a current of air can be induced into the coating zone, so as to react with a substance or substances issuing from such feed channel.

Figure 4:
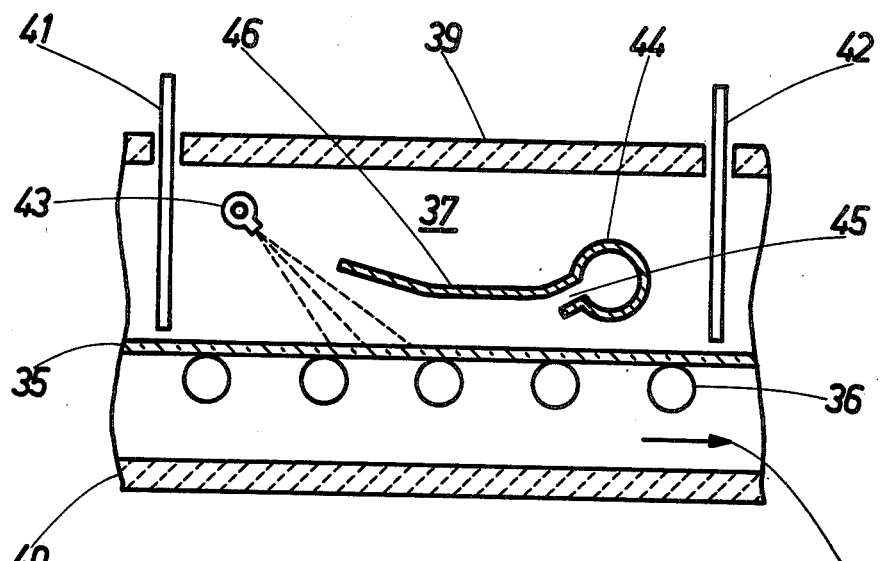
FIG. 4 is a sectional view of an embodiment of the invention similar to FIG. 1 further incorporating the use of an exhaust hood.

The coating apparatus shown in FIG. 4 is installed for coating a glass ribbon 35 during its conveyance on rollers 36 through a compartment 37 in the direction of arrow 38. The compartment 37 forms part of a gallery having roof and sole walls 39,40 and end screens 41,42. The coating apparatus includes a spray gun 43, arranged like the gun 9 in FIG. 1, for discharging a stream of droplets while being moved to and fro transversely across the path of the traveling glass ribbon. Downstream from the coating zone there is an exhaust duct 44 which also extends across substantially the full width of the glass ribbon path. This duct has a slot-like nozzle 45 facing generally toward the coating zone and is connected to means (not shown) for maintaining sub-atmospheric pressure in the duct so that gases are continuously drawn into the duct via its nozzle and exhausted from the apparatus. The suction forces are substantially uniform across the full width of the glass ribbon. A canopy 46 extends in the upstream direction from the top wall of nozzle 45, up to a position reaching over the zone at which the discharge stream from the spray gun 43 impinges on the glass ribbon.

Any of the coating apparatus described with reference to FIGS. 2 to 4, like the coating apparatus described with reference to FIG. 1, could be installed in a gallery associated with a float tank or with a sheet glass drawing machine.

By way of modification of the forms of apparatus shown in FIGS. 1 and 4, the single spray gun could be replaced by a plurality of spray guns which are mounted in side-by-side positions across the apparatus so that their discharge streams together extend over the full ribbon width to be coated. In such an apparatus the spray guns can, of course, remain stationary during the coating process. A discharge head extending across the ribbon path and having a plurality of spray orifices distributed therealong can be used as an alternative to a plurality of individual spray guns.

Various processes according to the invention and making use of apparatus as above described with reference to the accompanying drawings will now be described by way of example.

EXAMPLE 1

An apparatus as represented in FIG. 1 was employed for coating a ribbon of glass in course of its manufacture in a Libbey-Owens type drawing machine. The coating apparatus was disposed so as to spray the glass ribbon at a position where the glass temperature was of the order of 600° C. The spray gun 9 which was of conventional type and was reciprocated transversely of the ribbon path, was operated under a pressure of the order of some kilograms per square centimeter. The gun was directed so that the angle between the glass ribbon and the axis of the spray was 30° and the spray cone angle was 20°.

The spray gun was supplied with an aqueous or organic solution of tin chloride, e.g. a solution obtained by dissolving in water 400 g per liter of hydrated tin chloride ($SnCl_2.2H_2O$) and adding $NH_4HF_2$ in an amount of 65 g per liter. On contact with the hot glass ribbon, tin oxide doped with fluorine ions was formed as a coating on the glass. The discharge from the spray gun was regulated to a value such that a coating having a thickness of 8,400 Å formed.

The coating had a neutral tint viewed by reflected light. The coating had a high transmissivity in respect of visible light and had a very high reflective power in respect of radiation in the far infrared wavelength band. The coating possessed good electrical conductivity.

Microscopic examination of the coating showed that it was of a homogenous structure, comprising a regular arrangement of crystals, in contact with the glass.

In another process according to the invention the foregoing procedure was followed but using as the feed to the spray gun an aqueous solution of $TiCl_4$ so as to form on the glass ribbon a coating of $TiO_2$ having a thickness of 800 Å.

EXAMPLE 2

Coating apparatus as represented in FIG. 2 was employed for coating a ribbon of float glass in course of its travel from the float tank.

A mixture of $SnCl_4$ vapor and a small proportion of $SbCl_5$ entrained in a current of nitrogen, was discharged against the glass ribbon through feed channel 17. A stream of air was continuously discharged through feed channel 18. The coating apparatus was arranged so that these gas streams impinged on the glass ribbon where the temperature of the glass was 585° C. The exhaust system incorporating exhaust duct 23 was not employed in this process.

At the exposed face of the ribbon a reaction occurred resulting in the deposition of a layer of $SnO_2$ containing a small proportion of antimony oxide, the layer having a thickness of 4,000 Å.

The formed coating had a greenish tint viewed by reflected light. The coating possessed a high light-transmitting power and a high reflective power in respect of incident radiation in the far infrared wavelength band. Moreover, the coating had a good electrical conductivity.

In this case also, examination of the coating showed that in contact with the glass it had a homogenous structure characterized by a regular arrangement of crystals.

In a modification of the foregoing process, the same procedure was followed but the exhaust system was operated to exert continuous suction forces via the exhaust duct 23. These forces served to draw off vapors of surplus reactive substances and volatile reaction products from the zone between the feed channels and the exhaust duct. The resulting coating was found to have a homogenous structure over its entire thickness and the uniformity of the optical properties of the coating over a given area was of a very high standard. The diffuse light transmission of the coating was very small.

EXAMPLE 3

Apparatus as represented in FIG. 2 was employed for coating a ribbon of glass at a coating zone through which the ribbon was conducted and where the temperature of the glass was 200°.

The feed channel 17 was employed for conducting to the coating zone a stream of dry nitrogen entraining vapors of tetraethyl lead $Pb(C_2H_5)_4$. The feed channel 18 was employed to conduct to the coating zone a stream of dry nitrogen entraining hydrogen sulphide. Measures were taken to exclude oxygen from the environment in which the coating was formed and through which the coated ribbon traveled on leaving this zone.

The discharge of gases through the feed channels was regulated so that a lead sulphide coating 500 Å in thickness formed on the glass ribbon. This coating was grey viewed by reflecting light. The coating possessed a homogenous structure.

The foregoing procedure can be employed, e.g. for forming coatings of metallic nitride, carbide, arsenide or boride.

As a further example, it is possible to form a coating of nickel using only one of the feed channels, by delivering through this channel nickel carbonyl vapor which decomposes in contact with the hot glass with formation of the nickel coating in situ.

EXAMPLE 4

Coating apparatus as represented in FIG. 3 was employed for coating a ribbon of float glass during its transit from the float tank. In this process, the feed channel 32 was inclined at 30° to the glass ribbon and was located so as to conduct a vapor mixture into contact with the glass ribbon at a place where the temperature of the glass was 585° C. A stream of nitrogen entraining $SnCl_4$ vapor and a small proportion of $SbCl_5$ vapor was discharged through the said feed channel. The discharge of the vapor stream from the feed channel and along the glass ribbon in the direction of its travel had the effect of inducing a stream of air into the coating zone through the gap 34 between the said feed channel and the glass ribbon. This air mixed with the discharging vapors and a reaction occurred at the coating zone resulting in the formation on the glass of a coating of tin oxide containing a small proportion of antimony oxide as doping agent, the coating having a thickness of 2,500 Å.

The coating thus formed had a green tint in reflection. The coating had a high transmissivity in respect of visible light and a good reflective power in respect of radiation in the far infrared wavelength band. Moreover, the coating had a good electrical conductivity. The coating was characterized by a regular arrangement of crystals forming a homogenous structure in contact with the glass.

EXAMPLE 5

Apparatus as represented in FIG. 4 was used for coating a ribbon of glass in course of its manufacture in a Libbey-Owens type drawing machine. The coating apparatus was located so as to form a coating on the glass at a position along its path where the temperature of the glass was of the order of 600° C.

A single spray gun 43 was used which was reciprocated transversely of the ribbon path during the coating process. The gun was orientated so that the axis of the discharge cone from the gun was inclined at 25° to the glass ribbon. The spray cone angle was 20°.

The spray gun was fed with a solution obtained by dissolving in dimethylformamide 150 g per liter of cobalt acetylacetonate and 150 g per liter of iron acetylacetonate.

The exhaust system comprising the exhaust duct 13 was operated so as to keep a depression not exceeding some dozens of millimeters of water in the exhaust nozzle 45. The discharge from the spray gun was regulated so that a coating 550 Å in thickness, composed of $Co_3O_4$ and $Fe_2O_3$ formed on the glass ribbon. The coating thus formed had a bronze tint viewed by reflected light. The coating was found to possess a homogenous structure and to have good optical properties which were substantially uniform from one place on the coating to another.

In a modification of the foregoing process, the same procedure was followed for forming a colored coating on a ribbon of glass in course of its manufacture by the float process. The results obtained were similar.

What is claimed is:

1. A process for forming a uniform metal or metal compound coating on a face of a glass ribbon which comprises the steps of continuously longitudinally moving the glass ribbon in generally horizontal direction along a ribbon path, contacting the glass ribbon face while it is at elevated temperature, at a zone along the ribbon path, with a fluid medium containing a substance which undergoes chemical reaction or decomposition to form the metal or metal compound on said face, discharging continuously at least part of said fluid medium against said face in stream formation from stationary discharging means extending transversely across the ribbon path or from discharging means which are displaced to and fro transversely of the ribbon path, said stream formation having (1) a velocity component in the generally horizontal direction of movement of the glass ribbon and (2) an inclination to said face so that the acute or mean acute angle of incidence of the stream formation on said face, measured in a plane normal to said face and parallel with the direction of the glass ribbon movement, is not more than 60°.

2. A process as defined in claim 1, wherein the stream formation has an angle or mean angle of incidence on said face of not more than 45°.

3. A process as defined in claim 1, wherein the stream formation constitutes parallel streams all parts of which have substantially the same angle of incidence on the glass ribbon face.

4. A process as defined in claim 1, wherein the stream formation diverges from its source and the angle of divergence of such stream formation measured in a plane normal to the glass ribbon face being coated and substantially parallel with the longitudinal extend of the glass ribbon, is not more than 30°.

5. A process as defined in claim 1, wherein the stream formation is inclined to said face so that every part of such stream formation makes with the glass face, in a plane normal to said face and parallel with the longitudinal extent of the ribbon, an acute incidence angle of not more than 60°.

6. A process as defined in claim 5, wherein the stream formation is inclined to said face so that every part of such stream formation makes with the glass face, in a plane normal to said face and parallel with the longitudinal dimension of the ribbon, an acute incidence angle of not more than 45°.

7. A process as defined in claim 1, wherein part of the said fluid medium with which said glass ribbon face is contacted at said zone is induced to flow to said zone by the action of said stream formation.

8. A process as defined in claim 7, wherein said stream formation includes a vaporized metal compound and the discharge of such stream formation induces a current of air to flow to said zone whereby a coating of metal oxide is formed at said zone.

9. A process as defined in claim 1, wherein said face is the top face of a continuous ribbon of float glass which is in the course of being formed.

10. A process as defined in claim 9, wherein the zone at which fluid stream formation impinges on the top face of said ribbon is located downstream from the float tank and is a zone where the temperature of the glass is within the range 100° to 650° C.

11. A process as defined in claim 1, wherein the speed of movement of the glass ribbon and the volume rate of supply of said substance to the coating zone are such that the growth rate of the coating thickness is at least 1000 Å of coating thickness per second.

12. A process as defined in claim 1, wherein following coating of a given portion of the ribbon, the coating on that portion is subjected to a surfacing treatment whereby a top stratum of the coating is removed.

13. A process as defined in claim 12, wherein said surfacing treatment is carried out with a suspension of alumina in distilled water.

14. A process as defined in claim 1, wherein the process is performed so as to form on the glass ribbon face a coating having a thickness of from 100 Å to 10,000 Å.

15. A process as defined in claim 1, wherein force is exerted by means extraneous to said fluid stream formation to maintain flow of gas away from the coating zone and away from the source of such stream formation.

16. A process as defined in claim 15, wherein suction forces are exerted to draw gas away from the coating zone and the source of said fluid stream formation.

17. A process as defined in claim 1, wherein the substance which undergoes the chemical reaction or decomposition is delivered to said face in gaseous phase.

18. A process as defined in claim 1, wherein said stream formation discharged against the glass ribbon face is gaseous and is discharged so that such stream formation contacts the ribbon face simultaneously at all positions across substantially the entire width of the ribbon.

19. A process as defined in claim 1, wherein a stream of oxygen-containing gas and a separate stream of a vaporized metal compound with which oxygen reacts to form a metal oxide coating on the ribbon face to be coated are continuously supplied to such ribbon face at said coating zone.

20. A process as defined in claim 19, wherein a stream of a vaporized tin compound and a stream of oxygen-containing gas are supplied to said ribbon face at said zone to cause formation of a tin oxide coating.

21. A process as defined in claim 1, wherein the fluid medium stream formation discharged against the face of the glass ribbon comprises at least one stream of droplets comprising a metal compound which by pyrolysis forms the coating metal or metal compound on such face.

22. A process as defined in claim 21, wherein the fluid medium discharged against the glass ribbon face comprises at least one stream of droplets of a liquid composition containing a metal salt which by pyrolysis forms a metal oxide coating.

23. A process as defined in claim 22, wherein said droplet stream comprises droplets of a medium containing a tin compound.

24. A process as defined in claim 21, wherein said droplet stream is displaced to and fro transversely of the glass ribbon path.

25. A process as defined in claim 21, wherein said at least one droplet stream has an impingement zone on the glass ribbon which extends across substantially the whole width of the glass ribbon.

26. A process as defined in claim 21, wherein the distance, measured normally to said ribbon face, between that face and the position from which the droplet stream is discharged is from 15 to 35 cm.

27. Apparatus for use in forming a uniform metal or metal compound coating on a face of a glass ribbon, comprising
means for supporting a continuously longitudinally moving heated glass ribbon,
means for discharging continuously fluid medium in a stream formation against a face of a moving glass ribbon supported on said supporting means in a direction which is inclined thereto so that the stream formation has (1) a velocity component in the direction of movement of the glass ribbon and (2) an acute or mean acute angle of incidence on said face, measured in a plane normal to said face and parallel with the longitudinal direction of the ribbon of not more than 60°, said discharging means being either stationary and extending transversely across a glass ribbon supported on said supporting means or movable to and fro transversely across a glass ribbon supported on said supporting means.

28. Apparatus as defined in claim 27, wherein gas exhaust means is provided for generating suction forces which during use of the apparatus maintains a flow of gas away from the region where the stream formation of fluid medium makes contact with the glass ribbon face and away from the source of such stream formation.

29. Apparatus as defined in claim 27, wherein the apparatus includes means for displacing said discharge means to and fro transversely of the ribbon path.

30. Apparatus as defined in claim 27, wherein a float tank is mounted upstream with respect to said glass ribbon movement from said discharging means so that the fluid medium discharged therefrom will effect a coating of the top face of a ribbon of float glass as it travels away from said tank.

* * * * *